United States Patent [19]

Kawaguchi et al.

[11] Patent Number: 5,778,964
[45] Date of Patent: Jul. 14, 1998

[54] SOLID SPHERICAL BODY MANUFACTURING APPARATUS

[75] Inventors: Toranosuke Kawaguchi, Tokyo; Akikazu Maezono, Yokohama, both of Japan

[73] Assignee: Nihon Almit Co., Ltd., Japan

[21] Appl. No.: 776,307
[22] PCT Filed: May 30, 1996
[86] PCT No.: PCT/JP96/01454
§ 371 Date: Jan. 24, 1997
§ 102(e) Date: Jan. 24, 1997
[87] PCT Pub. No.: WO96/41699
PCT Pub. Date: Dec. 27, 1996

[30] Foreign Application Priority Data

Jun. 13, 1995 [JP] Japan .................... 7-170128

[51] Int. Cl.⁶ .................................................. B29B 9/10
[52] U.S. Cl. .................... 164/271; 164/129; 264/13; 425/6
[58] Field of Search .................. 164/129, 271; 228/56.3, 254; 264/5, 9, 13, 14; 425/6; 75/331, 335, 340

[56] References Cited

FOREIGN PATENT DOCUMENTS

| | | | |
|---|---|---|---|
| 119306 | 10/1930 | Austria | 264/13 |
| 3604169 | 8/1987 | Germany | 228/56.3 |
| WO 93/13897 | 7/1993 | WIPO | 75/340 |

*Primary Examiner*—Kuang Y. Lin
*Attorney, Agent, or Firm*—Bierman, Muserlian and Lucas

[57] ABSTRACT

An apparatus for manufacturing a solid spherical body of solder having high sphericity and high dimensional accuracy comprising a flat plate having a plurality of holes which penetrate the flat plate opening at its upper and lower surfaces, said upper surface being made of material which is not easily wetted by moltens or semi-molten substances, a space to be filled with said molten or semi-molten substance, a cylinder connected with said space, a piston which can elevate within said cylinder pressing said substance in said space upwards and ejecting it at said upper surface of said flat plate through the plurality of holes and a driving device which can move said piston up and down and the spherical bodies are formed by the action of the surface tension of the substance ejected.

9 Claims, 2 Drawing Sheets

5,778,964

SOLID SPHERICAL BODY MANUFACTURING APPARATUS

TECHNICAL FIELD

The present invention relates to a solid spherical body manufacturing apparatus for manufacturing solid spherical solder alloy or the like.

BACKGROUND TECHNOLOGY

In a conventional soldering process for a printed-circuit board, the printed-circuit board with chips mounted on it by using solder paste is mounted in a reflow soldering furnace in general. In this conventional process, however, it is difficult to make the interval of lead terminals in the electronic circuit on the printed-circuit board less than 0.5 mm. On the other hand, the junction by BGA (Ball Grid Array) method has been popular of late. For this reason, Sn-Pb solder alloy spherical bodies are in great demand. At Present, a manufacturer of such spherical bodies expects the sale of a million spherical bodies per a unit of mass production. These spherical bodies are manufactured by using a spray process in which they are manufactured from molten solder alloy through quenching or a centrifugal process.

In the conventional manufacturing process described above, however, the disunity of the diameter of the solder spherical body is unavoidable and it is extremely difficult to sift relatively uniform spherical bodies from all with high accuracy, for example with sphericity of ±0.02 mm resulting in a problem of high cost.

Thus the purpose of the present invention is to propose a solid spherical body manufacturing apparatus which can manufacture spherical bodies such as solder spherical bodies with high sphericity and high dimensional accuracy and enables the omission of solid spherical body sifting process.

DISCLOSURE OF THE INVENTION

The solid spherical body manufacturing apparatus according to the present invention is characterized in that it consists of a flat plate in which plurality of holes penetrate said flat plate and open at its upper and lower surfaces, said upper surface being made of material which is not easily wetted by molten or semimolten substance, a space which is to be filled with said molten or semi-molten substance, a cylinder which is connected with said space, a piston which can elevate within said cylinder pressing said substance upwards and ejecting it at said upper surface of said flat plate through said plurality of holes, and a driving device which can move said piston up and down and in that spherical bodies of said substance are manufactured by the action of the surface tension of said substance. Furthermore, the solid spherical body manufacturing apparatus according to the present invention may include a heating device for heating said ejected substance or metal paste by heating said flat plate, and as an alternative to this may include another type of heating device for heating the environment around said ejected substance or metal paste up to the temperature at which the surface tension of said ejected substance or metal paste can act to make it spherical.

According to the present invention, a piston can elevate within the cylinder pressing molten or semimolten substance upwards in said space and ejecting it at the upper surface through the plurality of holes. As the flat plate is made of material which is not easily wetted by said substance or metal paste, that is, as the contact angle constituted therebetween is big, in case the surface tension of the ejected substance or metal paste is big enough, spherical bodies can be manufactured, but in case the surface tension is not big enough, spherical bodies cannot be manufactured easily.

In case this ejected substance or metal paste forms a cylindrical shape, it can be transformed in a sphere by the exertion of surface tension growing through heating.

Particularly in case metal paste is used, solvent is evaporated by heating.

According to the manufacturing processes described above, as the unit weight of molten or semimolten substance or metal paste can be controlled with extreme accuracy, solid spherical bodies of solder alloy can be manufactured with high sphericity and high dimensional accuracy after cooling, resulting in the omission of a sifting process.

BEST CONDITION FOR WORKING THE INVENTION

Figure 1:
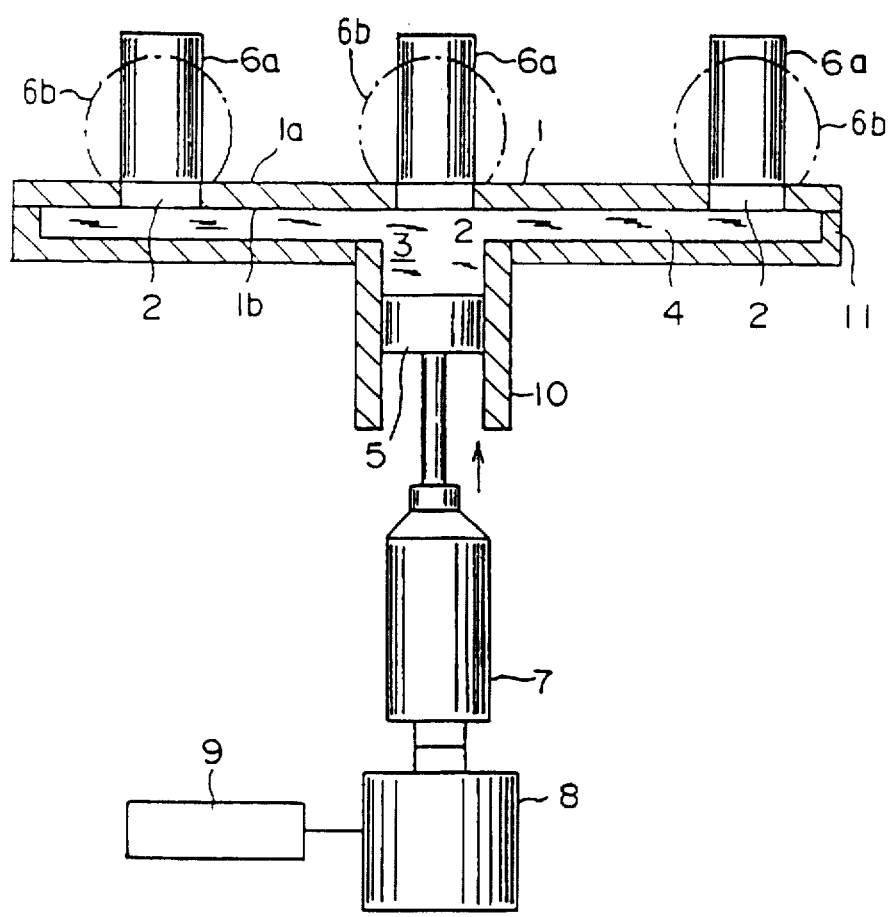
FIG. 1 is a schematic section showing the structure of an embodiment of the present invention.

We explain below the embodiments of the present invention referring to drawings. FIG. 1 is a schematic section showing the structure of an embodiment of the present invention on a solder alloy spherical body manufacturing apparatus. A flat plate 1 has plurality of holes 2 penetrating it and opening at the upper surface 1a and at the lower surface 1b of the flat plate 1.

The flat plate 1 is made of stainless steel which is not easily wetted by solder alloy 4 used for manufacturing solid spherical bodies. In case the solid spherical bodies are made of Aluminium for example, the flat plate 1 may be made of aluminium nitride (AlN) or its upper surface 1a may be coated with aluminium nitride.

Substance 4 such as molten or semimolten solder alloy is injected into the space 3, reaches the level of the lower surface 1b and fills the space 3. Substance 4 is injected through an inlet which is not shown but attached to a tank 11 and the tank 11 is closed by an inlet cover which is not shown. A cylinder 10 is connected with the space 3. The space 3 may be formed only in a cylinder of larger diameter and thus the tank 11 may be omitted.

As an alternative of molten or semimolten substance 4, metal paste of the mixture of powdery metal and solvent may be used.

A piston 5 can elevate within the cylinder 10 pressing the substance 4 in the space 3 upwards and ejecting it at the upper surface 1a of the flat plate 1 through plurality of holes 2, which results in the formation of spherical bodies 6b by the action of the surface tension. A driving device for moving the piston 5 up and down consists of a pulse motor 8, a control circuit 9 for controlling the rotation speed of the pulse motor 8 and a micrometer 7 for moving the piston 5 up and down driven by the pulse motor 8.

A heating device which is not shown is a device which comprises nichrome wire for heating substance 4 forming spherical bodies 6b after having been ejected at the upper surface 1a of the flat plate 1 and furthermore for controlling heating to manufacture spherical bodies 6 with high sphericity.

As an alternative of this heating device, another type of heating device for heating the environment surrounding substance 4 or metal paste ejected at the upper surface 1a up to the temperature enabling the action of the surface tension of the substance or the metal paste, such as a heating device producing laser beam, infrared beam or heated wind may be used.

In this case, the hole 2 may be tapered and the diameter of the hole 2 at the lower surface 1b may be smaller than that at the upper surface 1a. Because of this gradual change of the hole diameter, the flow of the substance 4 or the metal paste through the hole 2 can be smoother.

The flat plate 1 may form like a circular disk and the holes 2 may be disposed symmetrically with respect to the center of the disk. By means of this disposal, the extrusion force given to the substance 4 or the metal paste through the holes 2 by the piston 5 can be uniform.

Concretely speaking, we filled the space 3 with the substance 4 of molten solder alloy which consists of Sn of 60 weight % and Pb of 40 weight % using a flat plate 1 with holes 2 of 0.6 mm in diameter made of stainless steel of 3 mm in thickness. By means of two times rotation of the pulse motor 8 driven by the control circuit 9, the micrometer 7 moved the piston 5 upwards to press the substance 4 upwards.

In the result, the substance 4 was ejected at the upper surface 1a of the flat plate 1 through plurality of holes 2 to form cylindrical bodies 6a at first as shown in FIG. 1 and then transformed in spherical bodies 6b immediately as shown in FIG. 1 on condition that this ejected substance 4 was molten enough for the action of the surface tension. In case solder alloy is used as the substance 4, as its heat capacity and its surface tension are big, its spherical bodies 6b can be produced relatively easily. In case the cylindrical bodies 6a are formed, they can be transformed into the spherical bodies 6b by heating of the heating device.

Figure 2:
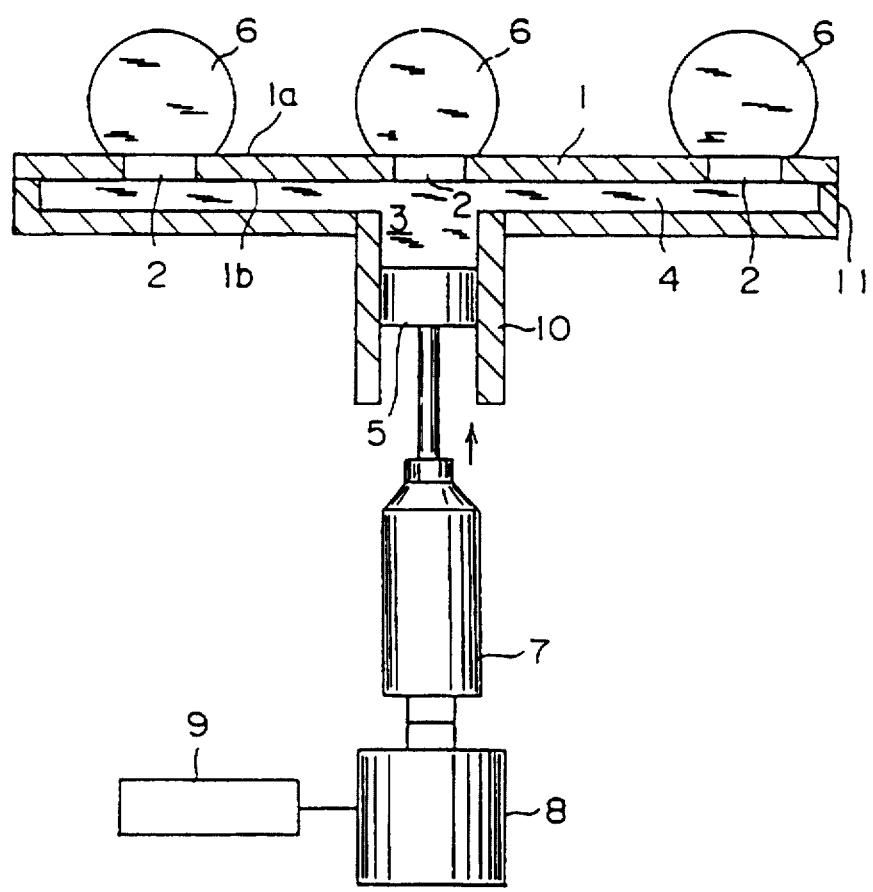
FIG. 2 is a schematic section showing the structure of another embodiment of the present invention.

Furthermore, for the purpose of enhancing the sphericity of the spherical body 6b of this solder alloy, we heated it for a minute keeping its temperature at 190° C. (eutectic molten state). As the result, the sphericity of the spherical body 6 was as high as ±0.01 % and almost perfect as shown in FIG. 2.

A reason why the solid spherical bodies are manufactured with high sphericity in this process is that the unit weight of substance 4 can be controlled with extreme accuracy by the pulse motor. We found that the solid spherical bodies 6 of solder alloy manufactured in this process could be used satisfactorily for BGA. In use of powdery solder paste, we used propyl alcohol or 5 % polyvinyl alcohol solution as solvent and heated the paste at 200° C. after its ejection.

A sweeper which is not shown may be attached for collecting the solid spherical bodies 6 at a predetermined position whenever they are manufactured and cooled enough.

Preferably the substance 4 is ejected at the upper surface 1a of the flat plate 1 in the environment filled with inert gas such as nitrogen.

We claim:

1. An apparatus for manufacturing a solid spherical body comprising a flat plate having a plurality of holes penetrating said flat plate and open at its upper and lower surfaces, its upper surface being made of aluminum nitride (AlN) which is not easily wetted by molten solder alloy, a space to be filled with said molten solder alloy, a cylinder which is connected with said space a piston which can elevate within said cylinder to press molten solder alloy upwards and eject it onto said upper surface of said flat plate through said plurality of holes, and a driving device to move said piston up and down, whereby spherical bodies of said molten solder alloy are formed by the action of the surface tension of said molten solder alloy.

2. An apparatus of claim 1 wherein a heating device for heating said molten solder alloy ejected at said upper surface by heating said flat plate is attached.

3. An apparatus of claim 1 provided with a heating device for heating the environment around said molten solder alloy ejected at said upper surface up to the temperature at which the surface tension of said molten solder alloy can act to make it spherical.

4. An apparatus of claim 1 wherein the holes are tapered and the diameter of said holes at the upper surface is smaller than that at the lower surface.

5. An apparatus of claim 1 wherein the flat plate is shaped like a circular disk and that said plurality of holes are disposed symmetrically with respect to the center of the flat plate.

6. An apparatus of claim 1 wherein said driving device consists of a pulse motor, a control circuit for controlling the rotational speed of said pulse motor and a micrometer for moving a piston up and down, driven by said pulse motor.

7. An apparatus of claim 1 provided with a sweeper for collecting said solid spherical bodies to a predetermined position whenever the formation of the solid spherical body has finished.

8. An apparatus of claim 1 provided with means to provide an environment of inert gas at the upper surface.

9. An apparatus of claim 1 wherein said upper surface is wholly constituted by aluminum nitride (AlN) which is not easily wetted by said molten solder alloy.

* * * * *